United States Patent
Takahashi et al.

(10) Patent No.: US 6,306,211 B1
(45) Date of Patent: Oct. 23, 2001

(54) METHOD FOR GROWING SEMICONDUCTOR FILM AND METHOD FOR FABRICATING SEMICONDUCTOR DEVICE

(75) Inventors: Kunimasa Takahashi, Osaka; Makoto Kitabatake, Nara; Masao Uchida, Osaka; Toshiya Yokogawa, Nara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/523,671

(22) Filed: Mar. 10, 2000

(30) Foreign Application Priority Data

Mar. 23, 1999 (JP) .................................. 11-077383

(51) Int. Cl.[7] .................................. C30B 25/14
(52) U.S. Cl. .................. 117/86; 117/89; 117/93; 117/102; 117/105
(58) Field of Search ................. 117/86, 89, 93, 117/102, 105

(56) References Cited

U.S. PATENT DOCUMENTS

| | | | |
|---|---|---|---|
| 4,479,845 | * 10/1984 | Nisizawa et al. | 117/2 |
| 5,278,435 | * 1/1994 | Van Hove et al. | 257/184 |
| 5,316,793 | * 5/1994 | Wallace et al. | 427/288.1 |
| 5,602,501 | * 2/1997 | Shiga | 327/105 |
| 5,796,902 | * 8/1998 | Bhat et al. | 385/122 |
| 5,895,952 | * 4/1999 | Darwish et al. | 257/230 |
| 6,015,459 | * 1/2000 | Jamison et al. | 117/2 |

OTHER PUBLICATIONS

J. Zhang et al., "Nitrogen impurity incorporation behavior in a chimney HTCVD process: pressure and temperature dependence", Materials Science and Engineering, B61–62, pp. 151–154, 1999.

* cited by examiner

*Primary Examiner*—Robert Kunemund
(74) *Attorney, Agent, or Firm*—Eric J. Robinson; Nixon Peabody LLP

(57) ABSTRACT

In a chamber, a substrate is mounted on a susceptor and then heated to an elevated temperature. Source and diluting gases are supplied into the chamber through source and diluting gas supply pipes provided with respective flow meters. In addition, a doping gas is also supplied through an additive gas supply pipe, which is provided with a pulse valve, and a gas inlet pipe into the chamber by repeatedly opening and closing the pulse valve. In this manner, a doped layer is grown epitaxially on the substrate. In this case, a pulsed flow of the doping gas is directly supplied through the pulse valve onto the substrate from the outlet port of a pressure reducer for a doping gas cylinder. As a result, a steeply rising dopant concentration profile appears in a transition region between the substrate and the doped layer, and the surface of the doped layer is planarized.

14 Claims, 16 Drawing Sheets

MICRO-PIPE

METHOD FOR GROWING SEMICONDUCTOR FILM AND METHOD FOR FABRICATING SEMICONDUCTOR DEVICE

BACKGROUND OF THE INVENTION

The present invention relates to a method for growing a semiconductor film on a substrate using gases and also relates to a method for fabricating a semiconductor device using the film growing method.

Recently, new semiconductor or semi-insulating materials have been researched and developed vigorously to realize a semiconductor device with special functions, e.g., specially enhanced radio frequency, emission or voltage-breakdown characteristics. For example, silicon carbide (SiC) is a semiconductor, which is harder, is less likely to be eroded with chemicals and has a wider band gap compared to silicon (Si), and is expected to be applicable to next-generation power electronic devices, radio frequency devices and devices operating at elevated temperatures. However, SiC has a polycrystalline structure, in which not only crystal grains with the same crystal structure and different crystallographic orientations but also crystal grains with various crystal structures coexist. Specifically, crystal grains of SiC include 3C SiC crystal grains with a cubic crystal structure and 6H SiC crystal grains with a hexagonal crystal structure.

Thus, a method for avoiding the formation of such a polycrystalline structure and thereby growing a single crystal SiC film with excellent crystallinity was proposed in Japanese Laid-Open Publication No. 62-36813, for example.

FIG. 16 schematically illustrates a structure of a known vertical SiC crystal grower. As shown in FIG. 16, the crystal grower includes chamber 100, susceptor 101, support shaft 114, quartz tube 115 and coil 103. The susceptor 101 is made of carbon and provides mechanical support for a substrate 102. The support shaft 114 is provided to support the susceptor 101 thereon. The coil 103 is wound around the quartz tube 115 for inductively heating the susceptor 101 with radio frequency current. The quartz tube 115 is so constructed as to allow cooling water to flow therethrough. The crystal grower is also provided with a gas supply system 107, in which cylinders of various gases to be supplied into the chamber 100 are disposed, and a gas exhaust system 111, in which a vacuum pump for exhausting these gases from the chamber 100 is disposed. The gas supply system 107 and the chamber 100 are connected together via source gas, diluting gas and additive gas supply pipes 104, 105 and 106 for supplying the source gases, a diluting gas such as hydrogen gas and an additive gas like a doping gas, respectively. The source gas supply pipe 104 is combined with the diluting gas supply pipe 105 at a midway point and then the combined pipe is connected to the chamber 100. At respective sites of the source gas and diluting gas supply pipes 104 and 105 before these pipes are combined, flow meters 108 and 109 are provided to regulate the flow rates of the gases supplied therethrough. Another flow meter 110 is provided for the additive gas supply pipe 106 to regulate the flow rate of the gas passing therethrough. The gas exhaust system 111 and the chamber 100 are connected together via an exhaust pipe 112, which is provided with a pressure regulating valve 113 for controlling the pressure inside the chamber 100.

Hereinafter, it will be exemplified how to grow a single crystal SiC film epitaxially on the substrate 102 of silicon or SiC by a CVD process.

First, suppose a single crystal SiC film is to be formed on a silicon substrate. In such a case, hydrocarbon (e.g., propane) and hydrogen gases are introduced from above and into the chamber 100 and the pressure inside the chamber 100 is regulated at atmospheric pressure or less. Radio frequency power is applied to the coil 103, thereby heating the substrate 102 up to about 1200° C. at the surface thereof. As a result, the surface of the substrate 102 is carbonized to grow a very thin SiC film thereon. Thereafter, the flow rate of the hydrocarbon gas supplied is reduced and a gas containing silicon (e.g., silane gas) is introduced into the chamber 100, thereby growing a cubic SiC film on the surface of the substrate 102.

Next, suppose an SiC substrate is used as the substrate 102. In such a case, a substrate having its principal surface slightly tilted from a (0001) plane (C-plane) by several degrees in the [11–20] direction (such a surface will be called an "off-axis (0001) plane") is often used. This is because 6H SiC single crystals can be grown on the off-axis (0001) plane, whereas 3C SiC twin crystals are usually grown on the exactly (0001)-oriented plane. By using an SiC substrate with the off-axis (0001) principal surface, an SiC film can be grown on the substrate 102 even without performing any carbonization process thereon if the temperature inside the chamber is set to 1500° C. or more. In adding a dopant to the SiC film, a doping gas is introduced through the additive gas supply pipe 106 into the upper part of the chamber 100. For example, when an n-type doped layer should be formed, nitrogen may be introduced. In such a case, the flow rate of the doping gas is controlled at a desired concentration using the flow meter 110. And when the SiC film is formed by this crystal growing process, the supply of respective gases through the pipes 104, 105 and 106 and the application of radio frequency power to the coil 103 are both stopped, thereby cooling down the substrate 102.

A horizontal crystal grower, in which the quartz tube 115 of the chamber 100 is placed to have its axis extend horizontally, is also used. The crystal grower includes the same main members as those of the vertical crystal grower shown in FIG. 16. But in the horizontal crystal grower, various gases are supplied through one of the side faces of the chamber.

The prior art crystal film forming method, however, suffer the following shortcomings.

Firstly, if a MESFET, for example, is formed using a semi-insulating substrate of SiC that has been formed by the above method, then the MESFET cannot always realize expected radio frequency characteristics or performance. Specifically, in a MESFET formed to have a GaAs film grown epitaxially on the substrate by the conventional technique, as the gate length thereof is shortened to cope with increase in operating frequency of the device, the transconductance thereof decreases. This is probably because an increased amount of current leaks from a heavily doped channel layer into a non-doped underlying layer due to a less sharp dopant concentration profile in a transition region between the non-doped and channel layers. Thus, according to a suggested technique, the decrease in transconductance is suppressed by reducing the leakage current using a steeply rising dopant concentration profile that has been created in the channel layer through implantation of a dopant of the opposite conductivity type into the underlying layer.

Such defects involved with that non-sharp dopant concentration profile are noticeable in an SiC crystal film, too. We also found similar defects in crystal films made of various materials other than SiC and GaAs.

Secondly, if an SiC crystal film is grown homoepitaxially on an SiC substrate with the off-axis (0001) principal surface, then large level differences are often formed. FIG. 6(a) illustrates the surface of an SiC crystal film formed by the conventional method. In FIG. 6(a), a surface state near a micro-pipe, which often appears on an SiC substrate, is shown to indicate the heights of the level differences. As shown in FIG. 6(a), a great number of level differences with a width of several hundreds nanometers and a height of several tens nanometers are formed on the surface of the SiC crystal film and the planarity of the SiC crystal film is not so good. We found that those level differences are observable particularly noticeably in a crystal film that has grown homo- or heteroepitaxially on a substrate having its principal surface slightly tilted from a densest plane like a C-plane.

That is to say, we noticed that the surface state of an epitaxially growing thin film is not controllable at an atomic level according to any of the conventional gas supply methods.

SUMMARY OF THE INVENTION

Thus, it is an object of the present invention to provide a method for epitaxially growing a doped crystal film with sharply rising dopant concentration profile by controlling the surface state of the growing thin film at an atomic level.

Another object of the invention is to provide a method for epitaxially growing a non-doped crystal film with sufficiently planar surface by controlling the surface state of the growing thin film at an atomic level.

A first semiconductor film growing method of the present invention is adapted to grow a semiconductor film epitaxially on a single crystal region of a substrate. The method includes the steps of: a) placing the substrate within a chamber; and b) forming the semiconductor film by supplying not only a source gas, which contains a constituent of the semiconductor film to be formed, but also an additive gas into the chamber after the step a) has been performed. The additive gas is supplied by pulse flow at least once.

According to the first method, an additive gas is supplied by pulse flow, i.e., a profusion of additive gas is supplied for just a short period of time. Thus, where the additive gas contains dopant atoms, a resultant concentration profile of the dopant steeply rises in a transition region between the substrate and the semiconductor film growing thereon. Also, no matter whether the additive gas contains dopant atoms or not, if those dopant atoms can suppress the movement of atoms in the source gas or molecules, which have been formed through bonding of these atoms, on the surface of the semiconductor film growing epitaxially, then those atoms or molecules contained in the source gas can be deposited uniformly. As a result, a semiconductor film with a sufficiently planar surface can be formed irrespective of the existence of dopant atoms in the semiconductor film. That is to say, the conventional problems can be solved by controlling the surface state of the epitaxially growing semiconductor film in this manner.

In one embodiment of the present invention, even in an interval during which the additive gas is not supplied as the pulse flow, the additive gas may also be supplied in the step b) at a flow rate, which accounts for a predetermined percentage or less of the height of the pulse. In such an embodiment, the capability of suppressing the movement of the atoms or molecules does not decrease because the additive gas is not supplied too much.

In another embodiment of the present invention, an interval during which the additive gas is not supplied as the pulse flow may be longer in the step b) than an interval during which the additive gas is supplied as the pulse flow. In such an embodiment, the capability of suppressing the movement of the atoms or molecules does not decrease either because the additive gas is not supplied too much.

In still another embodiment, a gas containing dopant atoms may be supplied in the step b) as the additive gas. In such an embodiment, a dopant concentration profile rises steeply in the transition region between the substrate and the semiconductor film growing. Thanks to this sharply rising profile, various devices with excellent radio frequency characteristics, such as a MESFET, can be obtained.

In this particular embodiment, a dopant concentration profile of the film may be controlled in the step b) by adjusting a pulse duration, i.e., the length of an interval during which the additive gas is supplied by the pulse flow. In this manner, the concentration of the additive gas can be easily controlled at a desired value.

In still another embodiment, at least one of an inert gas and a gas containing a halogen may be supplied as the additive gas in the step b). In such an embodiment, the movement of atoms in the source gas can be suppressed, thus planarizing the surface of the semiconductor film growing.

In yet another embodiment, the substrate may be an SiC substrate having its principal surface slightly tilted from a (0001) plane. Although level differences are usually formed on the surface of a single crystal SiC film with a wide band gap if the film is formed on an off-axis (0001) plane, those level differences can be substantially eliminated and a sufficiently planar surface can be formed according to the present invention.

A second semiconductor film growing of the present invention is adapted to grow a semiconductor film epitaxially by a CVD process on a single crystal region of a substrate such that the semiconductor film will be made of a compound of multiple elements. The method includes the steps of: a) placing the substrate within a chamber; and b) forming the semiconductor film by supplying source gases, which contain the respective elements of the semiconductor film to be formed, into the chamber after the step a) has been performed. At least one of the source gases is supplied by pulse flow at least once.

According to the second method, atoms continued in at least one of the source gases, which is apploed as the pulse flow, suppress the movement of atoms contain in the other source gases on the surface of the semiconductor film growing epitaxially. Thus, the composition changes sharply in the transition region between the single crystal region of the substrate and the semiconductor film. As a result, a semiconductor film with a planar surface can be obtained.

In one embodiment of the present invention, at least two of the source gases may be alternately supplied as pulse flows in the step b) such that an interval during which one of these two source gases is pulsed does not overlap with an interval during which the other source gas is pulsed. In such an bodiment, atoms contained in one of the at least two source gases alternately suppress the movement of atoms contained in the other source gas(es), thus increasing the planarity of the semiconductor film obtained.

In another embodiment of the present invention, a composition of the compound for the semiconductor film may be controlled in the step b) by adjusting a pulse duration. The pulse duration is the length of an interval during which the at least one source gas is supplied as the pulse flow. In this manner, the compound semiconductor film can be easily controlled to have its desired composition.

A first inventive method for fabricating a semiconductor device includes the steps of: a) growing a doped semiconductor layer epitaxially over a substrate by supplying, onto the substrate, not only a source gas but also a gas containing a dopant by pulse flow at least once; b) forming a gate electrode on the doped semiconductor layer such that the gate electrode makes Schottky contact with the doped semiconductor layer; and c) forming source and drain electrodes on right-and left-hand sides of the gate electrode over the doped semiconductor layer such that the source and drain electrodes make ohmic contact with the doped semiconductor layer.

In a MESFET obtained by this method, a dopant concentration profile rises steeply in a transition region between the substrate and the doped semiconductor layer. Accordingly, a semiconductor device, which can function as a radio frequency device with good pinch-off characteristics and high transconductance, can be obtained with the amount of current leaking from the doped semiconductor layer into the substrate reduced.

In one embodiment of the present invention, the first fabricating method may further include the step of forming a non-doped semiconductor layer on the substrate by supplying the same source gas as that will be supplied in the step a) before the step a) is performed.

A second fabricating method of the present invention is adapted to fabricate a heterojunction semiconductor device. The device includes first and second semiconductor layers formed in this order on a substrate such that a heterobarrier is formed between the first and second semiconductor layers. The method includes the steps of: a) forming the first semiconductor layer on the substrate; and b) growing the second semiconductor layer heteroepitaxially on the first semiconductor layer by supplying multiple source gases, at least one of which is supplied by pulse flow at least once.

According to the second fabricating method, the composition of the second semiconductor layer changes steeply in a transition region between the first and second semiconductor layers. Thus, the resulting semiconductor device can function as a heterojunction MISFET, which operates at high speeds by taking advantage of the steep heterobarrier.

DESCRIPTION OF THE PREFERRED EMBODIMENTS

Figure 1:
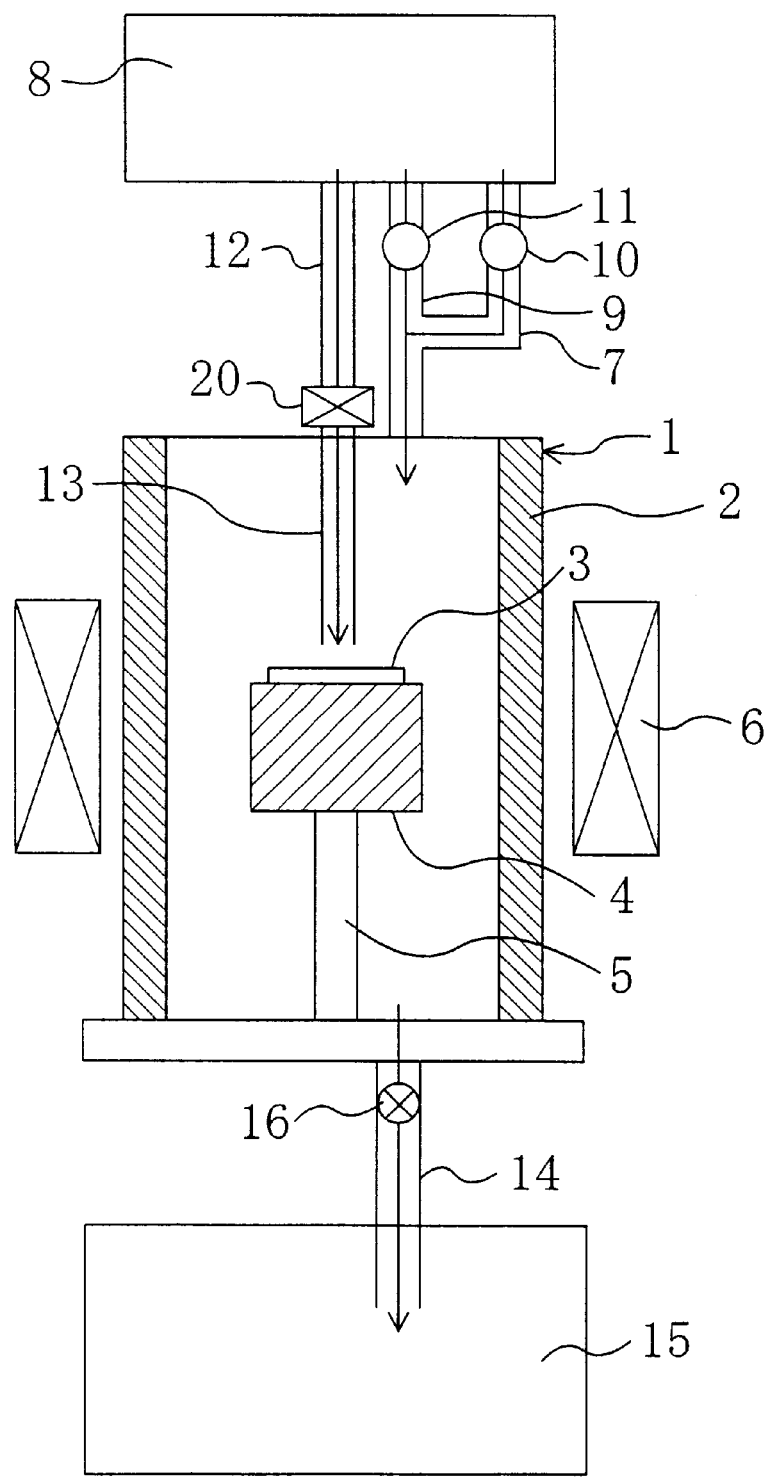
FIG. 1 schematically illustrates a structure of ae crystal grower that is used to form a thin film in respective embodiments of the present invention.

FIG. 1 schematically illustrates a structure of a crystal grower that is used to form a thin film in respective embodiments of the present invention.

As shown in FIG. 1, the vertical crystal grower includes chamber 1, susceptor 4, support shaft 5, quartz tube 2 and coil 6. The susceptor 4 is made of carbon and provides mechanical support for a substrate 3. The support shaft 5 is provided to support the susceptor 4 thereon. The coil 6 is wound around the quartz tube 2 for inductively heating the susceptor 4 with radio frequency current. The quartz tube 2 may be a double quartz tube so constructed as to allow cooling water to flow therethrough. The grower is also provided with a gas supply system 8, in which cylinders of various gases to be supplied into the chamber 1 are disposed, and a gas exhaust system 15, in which a vacuum pump is disposed to exhaust these gases from the chamber 1. The gas supply system 8 and the chamber 1 are connected together via source gas, diluting gas and additive gas supply pipes 7, 9 and 12 for supplying source gases, diluting gas such as hydrogen gas and additive gas like inert or doping gas, respectively. The source gas supply pipe 7 is combined with the diluting gas supply pipe 9 at a midway point and then the combined pipe is connected to the chamber 1. At respective sites of the source gas and diluting gas supply pipes 7 and 9 before these pipes are combined, flow meters 10 and 11 are provided to regulate the flow rates of the gases supplied therethrough. The gas exhaust system 15 and the chamber 1 are connected together via an exhaust pipe 14, which is provided with a pressure regulating valve 16 for controlling the pressure inside the chamber 1 by changing the flow rate of the gas exhausted.

The crystal grower of the present invention is characterized by further including a pulse valve 20 and a gas inlet pipe 13. The pulse valve 20 is provided at a midway point of the additive gas supply pipe 12. The gas inlet pipe 20 with a diameter of about 2 cm extends from the lower end of the additive gas supply pipe 12 into the chamber 1. And the far end of the gas inlet pipe 20 is opened at a position about 5 cm above the upper surface of the substrate 3.

The susceptor 4 may be coated with an SiC film to a thickness of about 100 μm to prevent degassing even when heated to an elevated temperature. It should be noted that the SiC film may be deposited to any arbitrary thickness so long as degassing is suppressible.

The source gases, which have been supplied from the gas supply system 8 via the source gas supply pipe 7, are confluent with the diluting gas, which has been fed through the diluting gas supply pipe 9. Then, the mixture is introduced from above and into the chamber 1. In this case, the flow rates of the source and diluting gases are controllable by using the flow meters 10 and 11.

On the other hand, a pulsed flow of the additive gas such as doping or inert gas is supplied through the additive gas supply pipe 12 onto the surface of the substrate 3 at regular intervals, i.e., as the pulse valve 20 is repeatedly opened and closed. The length of the interval during which the pulse valve 20 is opened (i.e., pulse duration) and that of the interval during which the pulse valve 20 is closed (i.e., pulse-to-pulse interval) may be set to respectively arbitrary values. For example, supposing the pulse duration is 100 μs and the pulse-to-pulse interval is 4 ms, the pulse valve 20 is repeatedly opened and closed about 240 times a second. The far end of the gas inlet pipe 13 may be located as close to the substrate 3 as possible. However, if the end is too close to the substrate 3, then the gas cannot be supplied by pulse flow to just a narrow range on the substrate 3. Thus, the end of the gas inlet pipe 13 is preferably spaced apart from the substrate 3 by about 5 cm.

The source, diluting and additive gases pass through the exhaust pipe 14 and then are exhausted by the gas exhaust system 15.

EMBODIMENT 1

Figure 2A:
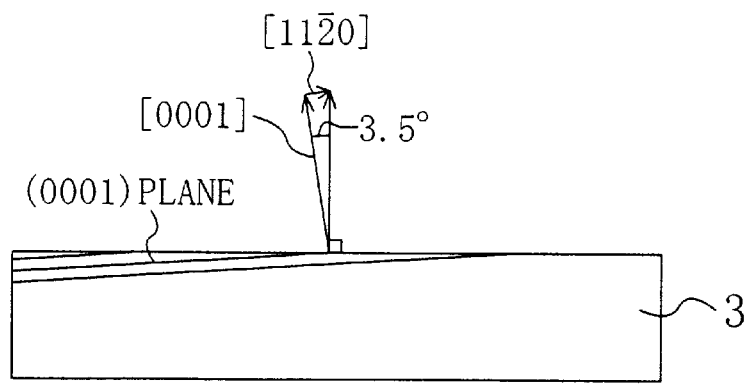
FIGS. 2(a) through 2(c) are cross-sectional views illustrating a method for growing a thin film in accordance with a first embodiment of the present invention.
Figure 2B:
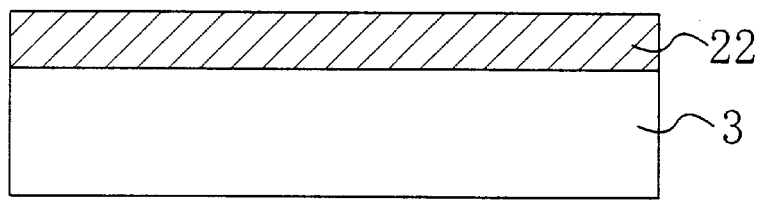
Figure 2C:
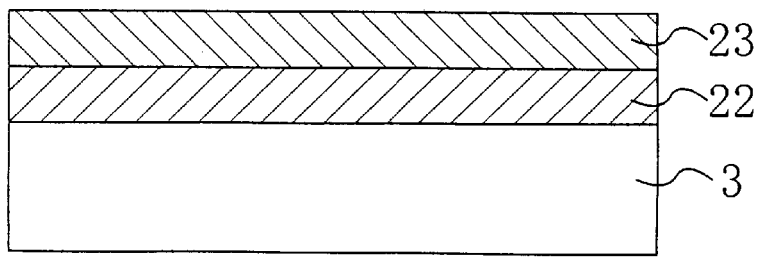

Hereinafter, a method for growing an n-type doped layer of hexagonal silicon carbide (6H SiC) homoepitaxially on a single crystal 6H SiC substrate 3 using the crystal grower shown in FIG. 1 will be described as a first embodiment of the present invention. The principal surface of the substrate 3 is supposed to be slightly tilted from a (0001) basal plane (i.e., C-plane) by several degrees. FIGS. 2(a) through 2(c) are cross-sectional views illustrating a method for growing the semiconductor film in accordance with the first embodiment.

As shown in FIG. 2(a), the principal surface of the 6H SiC substrate 3 is an off-axis (0001) plane, which is slightly tilted from a (0001) basal plane (i.e., C-plane) in the [11–20] direction by 3.5 degrees. Also, the surface of the substrate 3 is an n-type Si plane with Si atoms arranged on the surface thereof. The diameter of the substrate 3 is 25 mm. As described above, some micro-pipes are often observable on the surface of a 6H SiC substrate, and were actually found on the 6H SiC substrate 3 used in this embodiment, too. First, the substrate 3 is thermally oxidized at 1100° C. for about three hours within water vapor environment that has been bubbled with oxygen at a flow rate of 5 l/min, thereby forming a thermal oxide film to a thickness of about 40 nm on the surface thereof. Thereafter, the thermal oxide film is removed with buffered hydrofluoric acid, which is a mixture of hydrofluoric acid and aqueous solution of ammonium fluoride at a ratio of 1:7. Then, the substrate, from which the surface thermal oxide has been removed, is mounted on the susceptor 4 and the pressure inside the chamber 1 is reduced to create a vacuum at a pressure of about $10^{-6}$ Pa ($\approx 10^{-8}$ Torr).

Next, hydrogen and argon gases are supplied as diluting gases from the gas supply system 8 at respective flow rates of 2 and 1 l/min, thereby raising the pressure inside the chamber 1 to 0.0933 MPa (=700 Torr). The pressure inside the chamber 1 is controllable based on the valve travel of the pressure regulating valve 16. An RF power of 20 kW is applied to the coil 6 at a frequency of 20.0 kHz using an induction heater with the flow rates of hydrogen and argon gases maintained, thereby heating the susceptor 4. The temperature of the substrate 3 is also kept constant at about 1600° C. Then, propane and silane gases are supplied as source gases into the chamber 1 at respective flow rates of 2 and 3 ml/min with the flow rates of hydrogen and argon gases still kept constant. These source gases have been diluted with hydrogen gas at a flow rate of 50 ml/min. By supplying the propane and silane gases onto the 6H SiC substrate 3 placed on the induction-heated susceptor 4 in this manner, a non-doped layer 22 of 6H SiC single crystals is grown epitaxially on the principal surface (i.e., the off-axis (0001) lane) of the substrate 3.

Subsequently, nitrogen gas is additionally supplied as a doping gas into the chamber 1 while the source and diluting gases are continuously supplied thereto, thereby forming an n-type doped layer 23 on the non-doped layer 22 as shown in FIG. 2(c). In this case, the nitrogen gas can be directly supplied as the doping gas through the inlet pipe 13 to just over the substrate 3 by repeatedly opening and closing the pulse valve 20 while continuously supplying the source and diluting gases.

Figure 3:
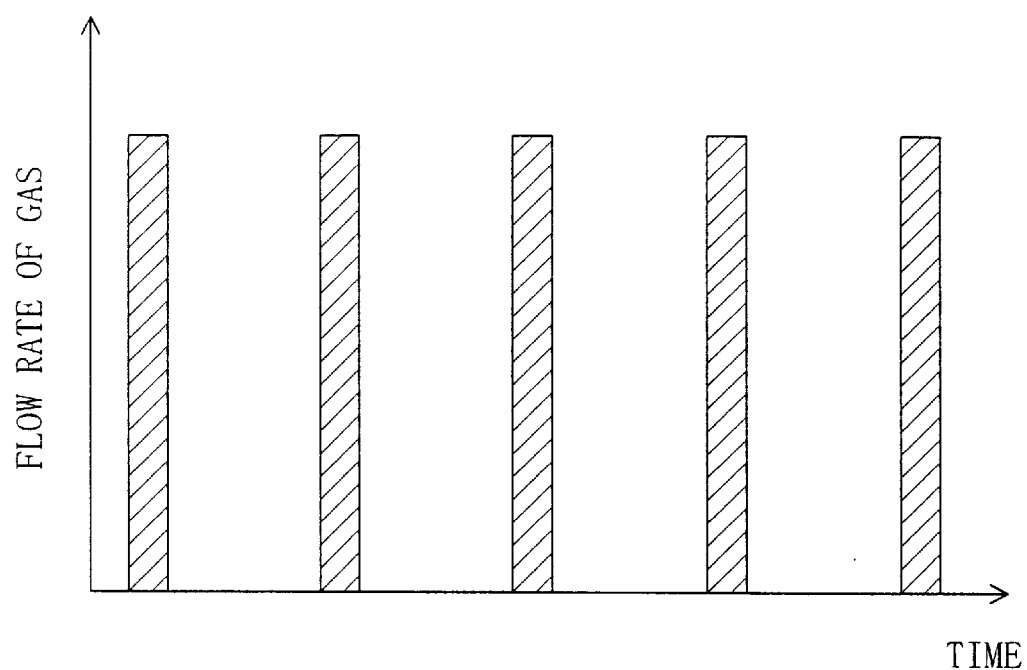
FIG. 3 illustrates how the flow rate of a gas changes with time as a pulse valve is repeatedly opened and closed in accordance with the first embodiment.

FIG. 3 illustrates how the flow rate of the nitrogen gas changes with time as the pulse valve 20 is repeatedly opened and closed. While the pulse valve 20 is opened, a lot of gas can be supplied almost directly and substantially without decreasing the valve outlet pressure of a pressure reducer for a gas cylinder in which the doping gas (nitrogen) is stored. This is because when the valve 20 is opened, the resistance to the gas flow is lower compared to the flow meter. Although not shown in FIG. 1, the $N_2$ gas cylinder is disposed inside the gas supply system 8. On the other hand, while the valve 20 is closed, the supply of the doping gas is suspended. In the illustrated embodiment, the length of each interval during which the pulse valve 20 is opened (i.e., pulse duration) is 110 μs, while the length of each interval during which the pulse valve 20 is closed (i.e., pulse-to-pulse interval) is 4 ms. The present inventors confirmed that the following effects are attainable if the n-type doped layer 23 is formed by repeatedly opening and closing the pulse valve 20 while supplying the doping gas.

Figure 4:
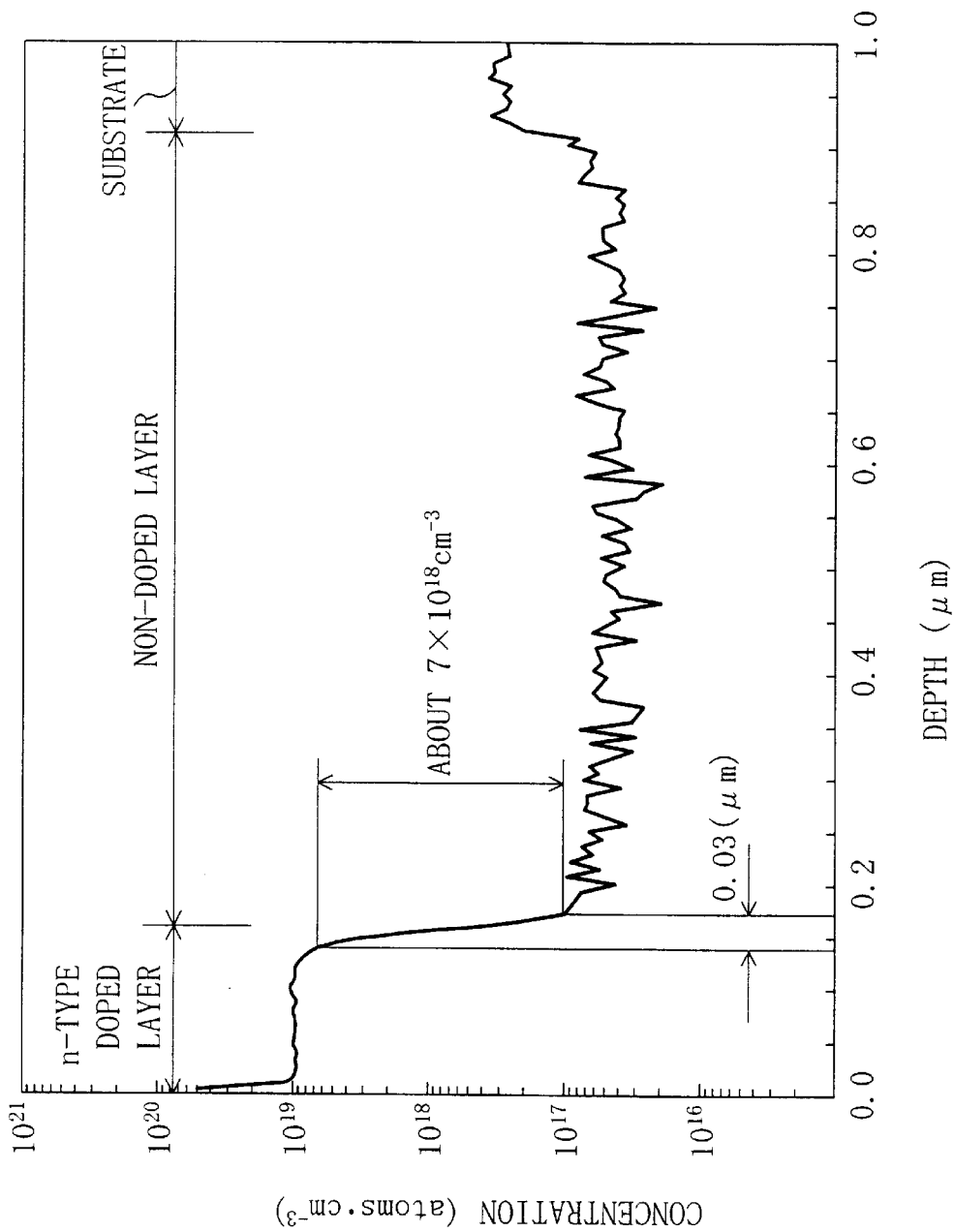
FIG. 4 illustrates a dopant concentration profile in the n-type doped layer, non-doped layer and substrate in the depth direction according to the first embodiment.

FIG. 4 illustrates a dopant concentration profile in the n-type doped layer 23, non-doped layer 22 and substrate 3 in the depth direction according to the first embodiment. In this case, the length of each interval during which the pulse valve 20 is opened (i.e., pulse duration) is 110 μs, while the length of each interval during which the pulse valve 20 is closed (i.e., pulse-to-pulse interval) is 4 ms. The concentration profile shown in FIG. 4 illustrates a result of secondary ion mass spectrometry (SIMS) depth profiling measurements. In FIG. 4, the axis of abscissas represents the depth (μm) as measured from the uppermost surface of the substrate, while the axis of ordinates represents the concentration of nitrogen (atoms·cm$^{-3}$) introduced as a dopant.

Figure 5:
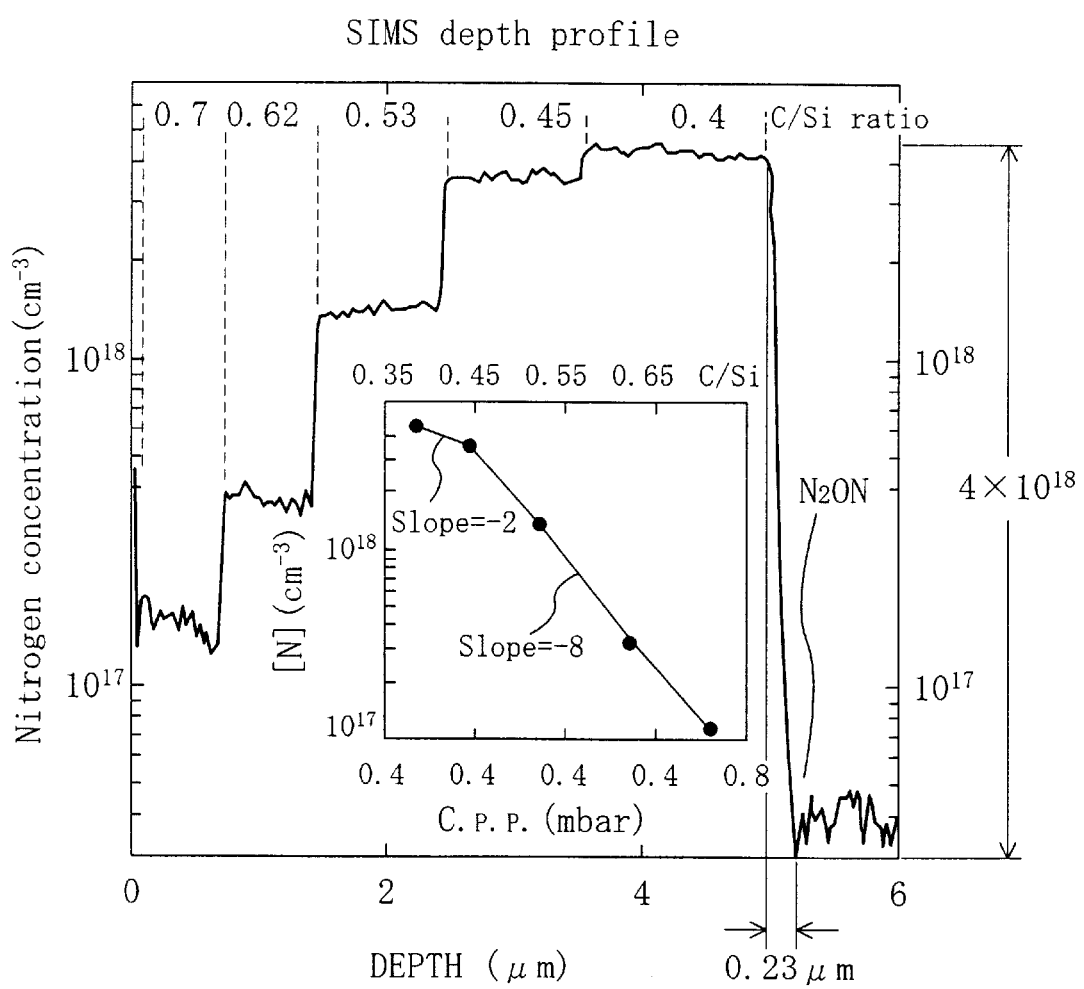
FIG. 5 illustrates a nitrogen concentration profile in a conventional SiC layer as disclosed in *Materials Science and Engineering*, B61–62 (1999), pp. 121–154.

FIG. 5 illustrates a nitrogen concentration profile in an SiC layer as disclosed in *Materials Science and Engineering*, B61–62 (1999), pp. 121–154. In FIG. 5, the axis of abscissas represents the depth (μm) as measured from the surface of the substrate, while the axis of ordinates represents the concentration of nitrogen (atoms·cm$^{-3}$). In accordance with this conventional method, a steep nitrogen concentration profile is also supposed to be attainable by getting a closed flow meter wide opened. In this case, the flow rate of nitrogen is 0.15 ml/min.

The results shown in FIGS. 4 and 5 will be compared. First, the nitrogen concentration gradient in a transition region between the non-doped and n-type doped layers of the present invention is $7 \times 10^{18}$ atoms·cm$^{-3}$/0.03 $\mu$m=$2.3 \times 10^{17}$ atoms·cm$^{-3}$/nm. In contrast, the nitrogen concentration gradient in a transition region as disclosed in the above-identified document is $4 \times 10^{18}$ atoms·cm$^{-3}$/0.23 $\mu$m=$1.7 \times 10^{16}$ atoms·cm$^{-3}$/nm. Thus, according to the method of the present invention, the concentration gradient of the doping gas can be increased by about one order of magnitude compared to the ordinary method of introducing nitrogen gas with a closed flow meter wide opened. This is probably because according to the conventional method disclosed in the document, the gradient of the concentration profile unintentionally becomes gentler in the depth direction of the doped layer due to a time lag. That is to say, if the nitrogen gas is supplied as the doping gas via a flow meter, some delay is inevitable between a point in time the nitrogen gas starts to be supplied and a point in time the gas actually reaches the surfaces of crystals and is doped thereto. In contrast, according to the present invention, the nitrogen gas is supplied to the n-type doped layer 23 almost directly from the outlet port of the pressure reducer for the gas cylinder. Thus, the dopant atoms can be supplied very heavily in just a short period of time after the doping gas started to be supplied. For that reason, the dopant concentration profile is steeper in the transition region.

In addition, the nitrogen concentration in the n-type doped layer 23 shown in FIG. 4 is less variable than that of the nitrogen doped layer shown in FIG. 5. Thus, it can be seen that nitrogen has been doped more uniformly according to the present invention.

As can be understood from these results, by directly and periodically supplying the doping gas from the outlet port of the pressure reducer for the gas cylinder through the pulse valve, a doped layer with a more uniform concentration can be formed and yet the concentration profile in the transition region can rise far more steeply compared to the conventional method.

Also, according to the inventive method, even when an SiC layer is grown epitaxially on an SiC substrate with an off-axis C plane as its principal surface, level differences can be eliminated and an SiC layer with a sufficiently planar surface can be formed. This point will be detailed below.

Figure 6A:
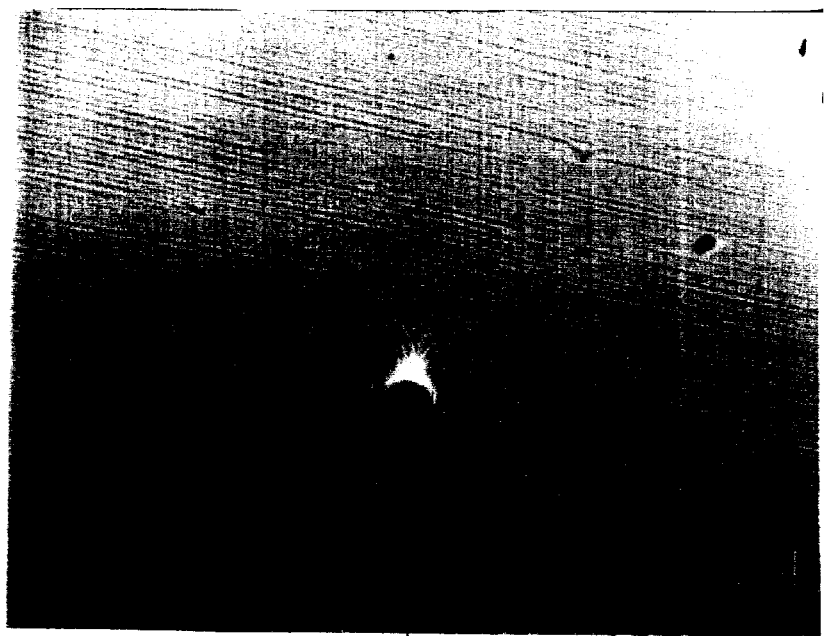
FIGS. 6(a) and 6(b) are micrograms illustrating the surface of an SiC layer formed by a conventional method and that of an SiC layer formed by the method of the first embodiment, respectively.
Figure 6B:
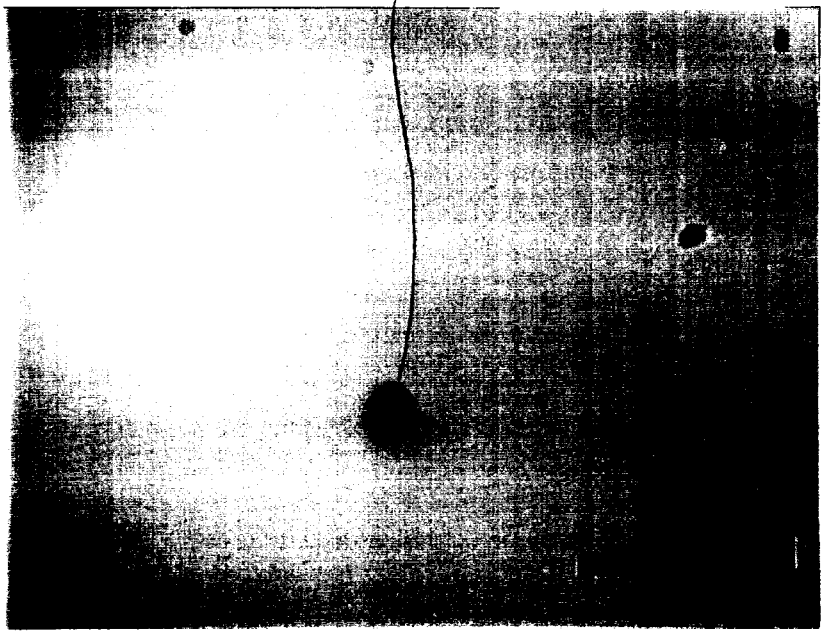

FIGS. 6(a) is a microgram illustrating the surface of an SiC layer formed by the conventional method, in which source, diluting and doping gases are supplied through respective supply pipes provided with flow meters. FIG. 6(b) is a microgram illustrating the surface of an SiC layer formed by the method of the first embodiment, in which the doping gas is supplied through the supply pipe provided with only the pulse valve, not any flow meter. These micrograms illustrate the surface states that were observed with a laser microscope. It should be noted that micro-pipes, which already exist on the surface of the SiC substrate, are still observable in both FIGS. 6(a) and 6(b) to make the planarity and the widths of level differences easily understandable.

As shown in FIG. 6(a), level differences with a step height of several tens nanometers (which is equivalent to the total height of about 100 atomic layers) and a terrace width of several hundreds nanometers are formed on the surface of the epitaxial film including the n-type doped layer formed by the conventional method without using the pulse valve. As opposed to the conventional method, no level differences are observable on the surface of the epitaxial film formed by the inventive method and the surface is very flat as shown in FIG. 6(b).

As described above, in growing a single crystal SiC layer homoepitaxially on an SiC substrate, an off-axis (0001) substrate has been used usually. This method has been preferred because of the following reasons. Specifically, in accordance with this method, the density of steps on the surface of the substrate increases to create a flow of steps. As a result, a 6H SiC single crystal layer can grow homoepitaxially according to the stacking order of the substrate even at a low temperature. Thus, this method is called "step control epitaxy" or "off-axis method". However, as a result of experiments carried out by the present inventors, we found that a large number of level differences are easily formed on the surface according to this conventional method as shown in FIG. 6(a). We cannot explain so clearly at this time why and how this phenomenon happens. But we believe that the SiC layer locally grows faster at particular ones of many level differences existing on the off-axis (0001) plane. This is probably because when Si and C atoms are deposited on the surface of the SiC substrate or after SiC molecules have been formed as a result of bonding of Si and C atoms, those atoms or molecules migrate to more energetistically favorable sites.

In contrast, according to the inventive method, no sooner has the pulse valve been opened than a great number of dopant atoms (i.e., N atoms) are supplied onto the surface of the SiC substrate to interfere with the movement of Si and C atoms or SiC molecules. As a result, the non-doped and n-type doped layers 22, 23 would be deposited almost uniformly on the underlying surface of the off-axis (0001) plane. Accordingly, the 6H SiC epitaxial layer can be formed substantially in parallel to the off-axis (0001) plane and a planar surface can be obtained finally.

We confirmed based on the results of experiments that the movement of Si and C atoms and SiC molecules can be interfered with during epitaxial growth of the SiC layer by supplying, as an additive gas, a pulsed flow of a gas containing atoms with a mass large enough to constitute resistance against the movement of those atoms or molecules.

A single crystal SiC layer with a planar surface can be formed by supplying, as an additive gas, a pulsed flow of any of various gases during epitaxial growth of the SiC layer. Examples of those gases include: a gas containing nitrogen (N) atoms as n-type dopant atoms; a gas containing phosphorus (P) atoms as n-type dopants atoms (e.g., phosphine); a gas containing aluminum (Al) atoms as p-type dopants atoms (e.g., TMA); a gas containing boron (B) atoms as p-type dopants atoms (e.g., diborane); an inert gas such as Ne, Ar, Kr or Xe gas; and a gas containing halogen atoms such as F, Cl or Br atoms. Preferably, these atoms should not affect the operation of a device that will be formed using the single crystal SiC layer. Particularly where the additive gas contains dopant atoms, a sharply rising dopant concentration profile is attainable as described already.

Also, even if the source and diluting gases are supplied by pulse flows, the movement of atoms contained in these gases is interfered with each other, thus also improving the planarity of the resulting epitaxial layer.

Even when the non-doped layer 22 is formed, a pulsed flow of a gas containing atoms that can interfere with the movement of the Si and C atoms or SiC molecules (e.g., a fluorine gas) is also preferably supplied through the additive gas supply pipe 12. In such a case, the fluorine atoms, for example, can interfere with the movement of those atoms and molecules during epitaxial growth. As a result, the resulting non-doped layer 22 has a planar surface. Accordingly, if the interface between the non-doped and n-type doped layers 22, 23 should be planar, this technique is applicable very effectively.

We also confirmed that even those level differences existing on the non-doped layer 22 can be finally eliminated and the surface of the n-type doped layer 23 can be flattened by supplying a pulsed flow of the dopant gas, for example, while the n-type doped layer 23 is formed.

In the foregoing, an embodiment of the present invention has been described as being applied to growing a single crystal film epitaxially on the SiC substrate that uses an off-axis (0001) plane as its principal surface. Alternatively, the present invention is also applicable to, and contributes to improvement of the surface planarity of, a general-purpose Si substrate using a (001) plane as its principal surface. Specifically, in a CVD process according to the present invention, by separately supplying a pulsed flow of a gas, which contains atoms that can interfere with the movement of constituents of a crystal layer to be grown epitaxially, onto the growing surface, the planarity thereof can be improved. Thus, the inventive method is generally and broadly applicable to growing a single crystal film epitaxially on an Si, GaAs, SiGe, SiGeC or GaN substrate, not just to the epitaxial growth on the SiC substrate.

A technique of growing a single crystal Si layer epitaxially on an off-axis (111) plane of an Si substrate, which is slightly tilted from a (111) plane by 2 to 4 degrees, is one of known methods equivalent to the method using the off-axis (0001) plane. A (111) plane of Si crystals corresponds to a (0001) basal plane of hexagonal crystals and is denser than is any other plane thereof. A (001) plane often used is greatly tilted from a (111) plane and the density of steps existing on the (001) plane is very high. Accordingly, a film can be grown epitaxially on the (001) plane to a uniform thickness. On the other hand, if an exactly oriented plane is used as the densest plane of crystals to be grown, then those crystals are likely to grow abnormally because there are almost no steps on the plane. To avoid such a situation, a substrate with the off-axis (111) principal surface is often used. Even if that off-axis (111) plane is used as a principal surface, noticeable level differences such as those illustrated in FIG. 6(a) are sometimes observable on the surface of an epitaxially growing layer depending on the growth conditions thereof. However, if the inventive method is implemented using such an off-axis (111) plane, then the surface of an epitaxial layer growing thereon is sufficiently planar and has almost no outstanding level differences. That is to say, remarkable effects are attainable by applying the inventive method to growing a single crystal layer epitaxially on any principal surface of a substrate so long as the principal surface is a plane slightly tilted from a densest plane.

Figure 7:
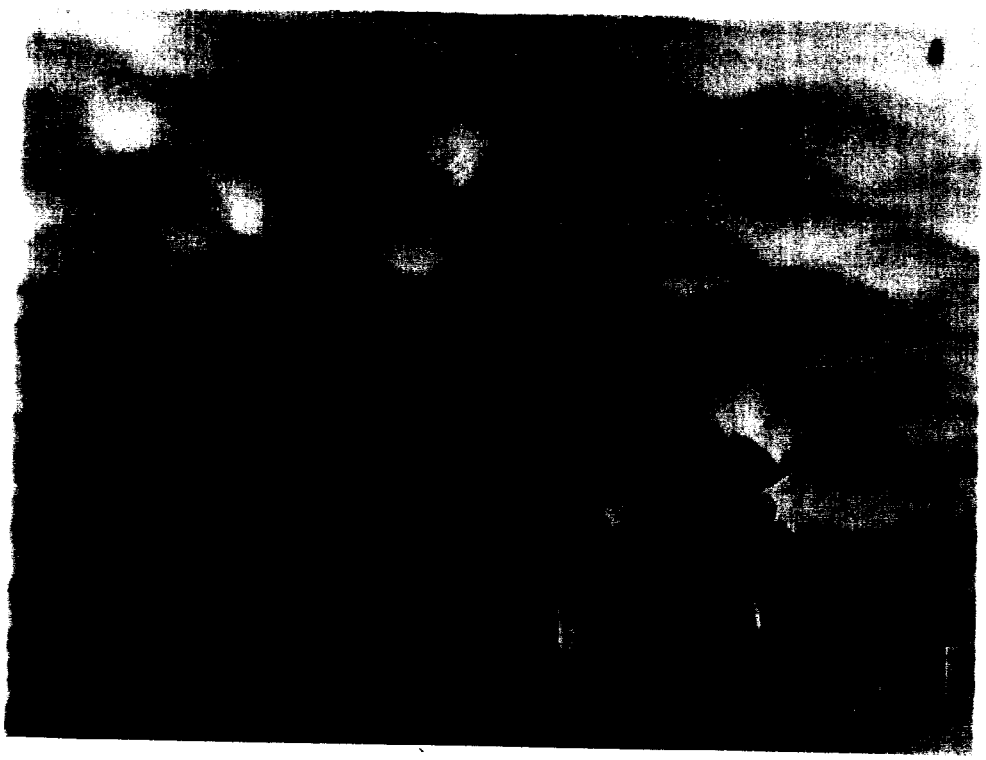
FIG. 7 is a microgram illustrating a surface state of an n-type doped layer that was formed with a pulse valve opened for an excessively long time (i.e., for an excessively long pulse duration).

It should be noted that if the interval during which the pulse valve is opened (i.e., pulse duration) is too long, then some problems might be brought about. FIG. 7 is a microgram illustrating the surface state of an n-type doped layer that was formed with the pulse valve opened for 1000 $\mu$s (i.e., for an excessively long pulse duration). As shown in FIG. 7, if too much doping gas is supplied continuously, then the surface of the n-type doped layer (i.e., an epitaxial layer) adversely roughens.

Figure 8:
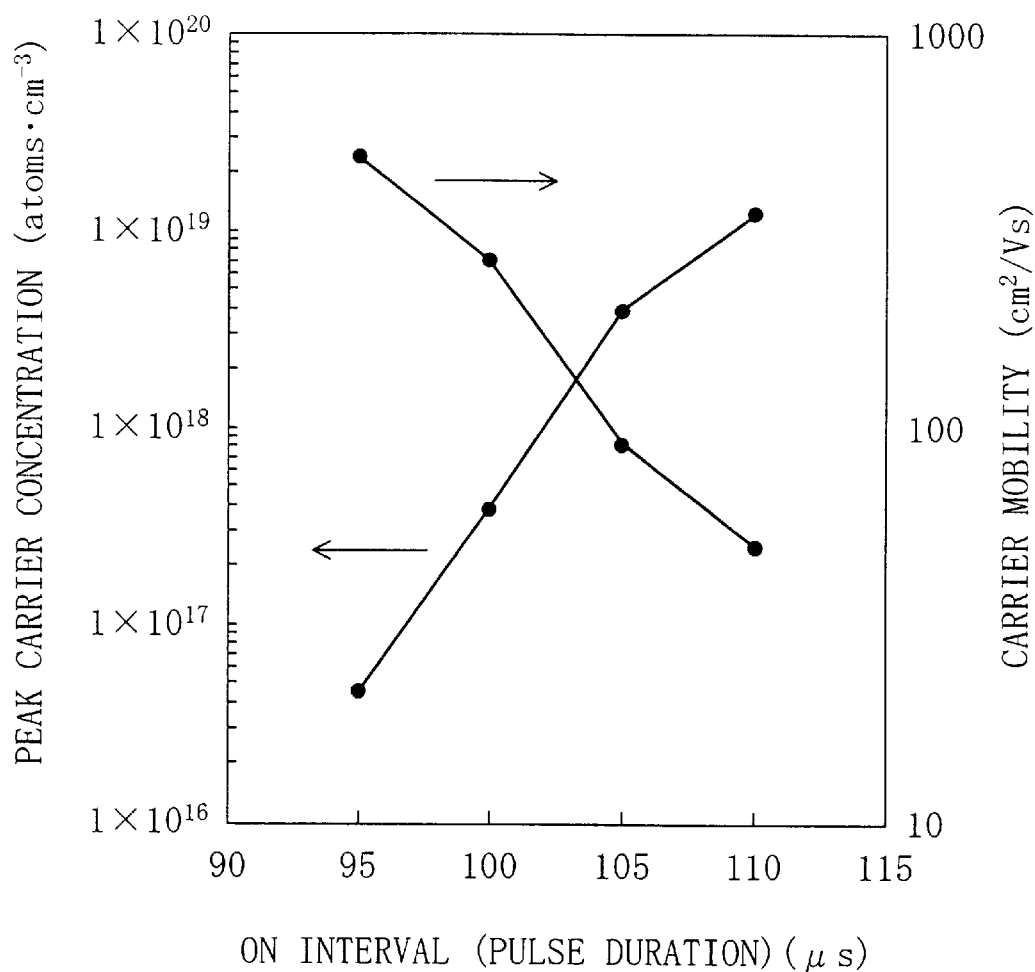
FIG. 8 illustrates how the peak carrier concentration and carrier mobility of an n-type doped layer change with the length of an interval during which the pulse valve is opened in accordance with the first embodiment.

FIG. 8 illustrates how the peak carrier concentration (atoms·cm$^{-3}$) and carrier mobility (cm$^2$/Vs) of an n-type doped layer change with the length of an interval during which the pulse valve is opened (i.e., the pulse duration) in accordance with the first embodiment. In the following description, the interval during which the pulse valve 20 is opened will be called an "ON interval", while the interval during which the pulse valve 20 is closed will be called an "OFF interval". In this case, the valve outlet pressure of the pressure reducer for the gas cylinder in the gas supply system 8 is supposed to be constant at 78400 Pa (0.8 kgf/cm$^2$), the length of the ON interval is changed and that of the OFF interval is kept constant at 4 ms.

As can be seen from FIG. 8, the peak carrier concentration in the n-type doped layer is controllable by changing the length of the ON interval. In other words, the peak carrier concentration is also controllable by changing the length of the OFF interval. Specifically, where the length of the OFF interval between pulses is kept constant, the peak carrier concentration can be increased considerably from 5×10$^{16}$ atoms·cm$^{-3}$ to about 1×10$^{19}$ atoms·cm$^{-3}$ only by changing the length of the ON interval (i.e., pulse duration) from 95 $\mu$s to 110 $\mu$s.

Figure 9:
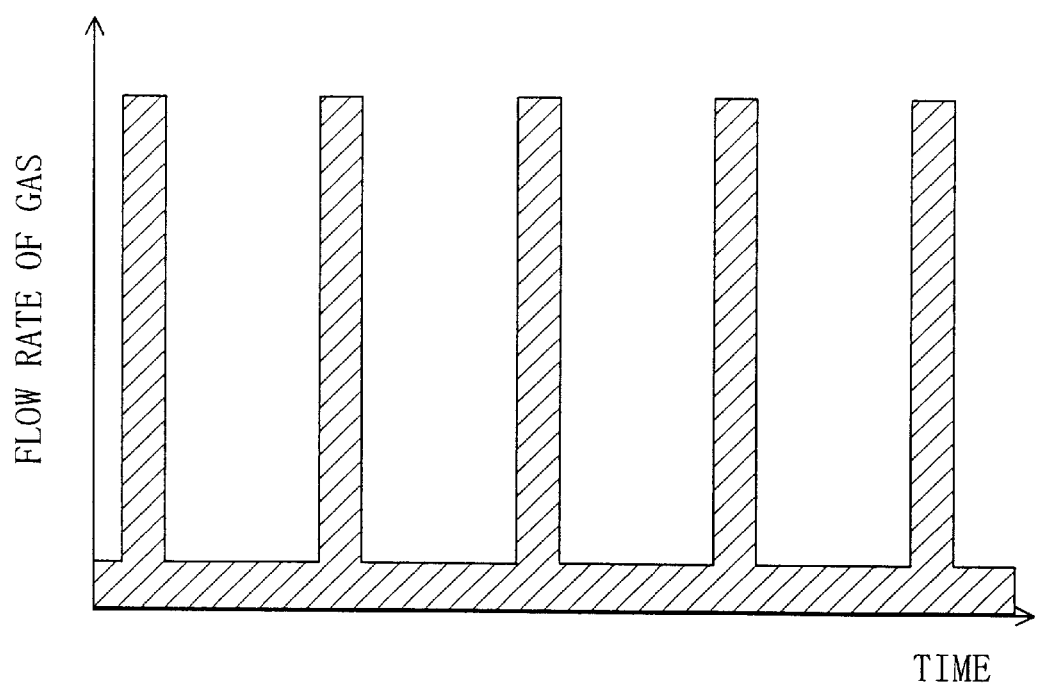
FIG. 9 illustrates a modified method for controlling the pulse valve in accordance with the first embodiment.

FIG. 9 illustrates a modified method for controlling the pulse valve in accordance with the first embodiment. As shown in FIG. 9, according to this modified example, the supply of the additive gas such as the doping gas is not stopped completely but the additive gas is continuously supplied in a small amount between the ON intervals during which the pulse valve is opened (i.e., pulse-to-pulse interval). Specifically, the additive gas (e.g., nitrogen gas) may be supplied as a carrier gas. In this case, the additive gas is preferably supplied at a flow rate, which accounts for 10% or less of the pulse height, in the pulse-to-pulse interval.

In the foregoing embodiment, an n-type doped layer is formed using nitrogen as an n-type dopant. Alternatively, a doping gas containing any other element as an n-type dopant may also be used.

Although the n-type doped layer is formed in the foregoing embodiment, a p-type doped layer, which also shows a steeply rising concentration profile in the transition region between the doped layer and an underlying layer, may be naturally formed by using a doping gas with p-type conductivity.

Also, the n-type doped layer is formed on the non-doped layer in the foregoing embodiment. However, the non-doped layer is not always required. Furthermore, the n-type doped layer may be formed by the pulsed supply of a doping gas either on a p-type doped layer or on another n-type doped layer that has been formed by the conventional method.

Moreover, in the foregoing embodiment, a method of growing a doped layer epitaxially on an SiC substrate has been exemplified. Alternatively, the thin film growing method of the present invention is applicable to growing a doped layer epitaxially on any substrate other than the SiC substrate, e.g., Si, GaAs, SiGe, SiGeC or GaN substrate. In any case, a doped layer can be formed to show a steeply rising concentration profile in a transition region between the doped layer and an underlying non-doped layer or substrate.

Furthermore, a CVD process using induction heating is adopted in the foregoing embodiment as a method of growing a thin film on a base member. However, the inventive thin film growing method is effectively applicable to growing a thin film on a base member by plasma CVD, photo-assisted CVD or electron beam CVD so long as the thin film is grown using gases.

EMBODIMENT 2

Next, a MESFET including an SiC substrate, on which a doped layer is formed by the thin film growing method according to the first embodiment, will be described as a second exemplary embodiment of the present invention.

Figure 10:
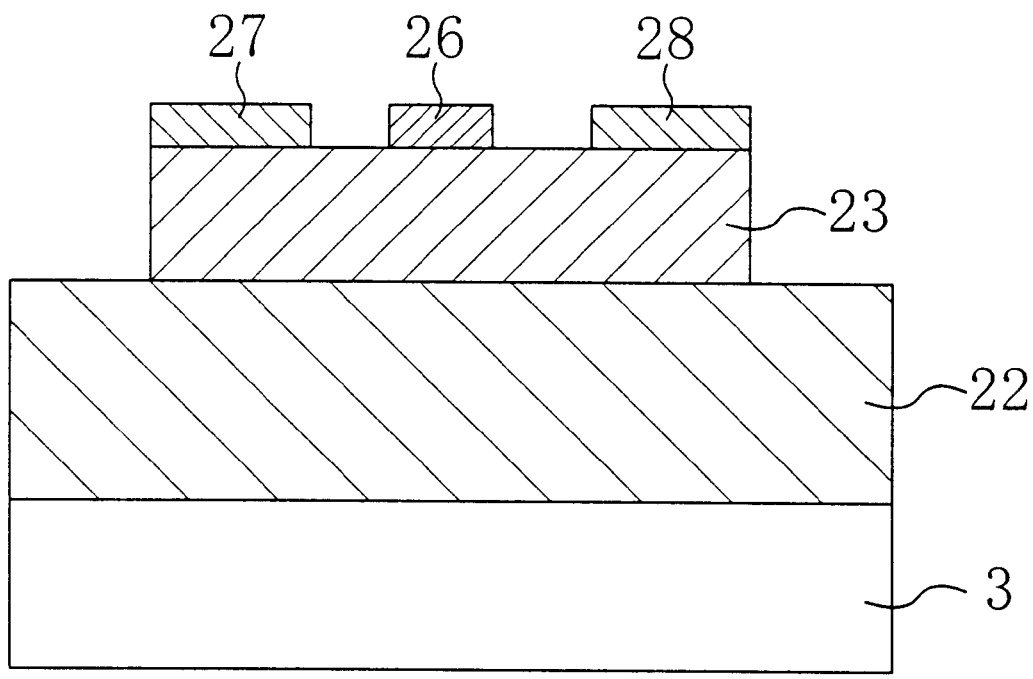
FIG. 10 is a cross-sectional view of a MESFET according to a second embodiment of the present invention.

FIG. 10 is a cross-sectional view of a MESFET according to the second embodiment. As shown in FIG. 10, the MESFET uses a 6H SiC substrate 3 with an off-axis (0001) principal surface. A non-doped layer 22 of SiC single crystals is grown epitaxially on the substrate 3. An n-type doped layer 23 of SiC single crystals is grown epitaxially on the non-doped layer 22 by supplying a pulsed flow of nitrogen gas. A gate electrode 26 and source/drain electrodes 27, 28 are formed on the n-type doped layer 23. The source/drain electrodes 27, 28 are located on right- and left-hand sides of the gate electrode 26. And the n-type doped layer 23 herein functions as a channel layer of the MESFET.

According to the second embodiment, the MESFET is formed in the following manner. First, as already described in the first embodiment, hydrogen and argon gases are supplied from the gas supply system 8 shown in FIG. 1 at respective flow rates of 2 and 1 l/min, thereby inductively heating the susceptor 4. Then, propane and silane gases are supplied at respective flow rates of 2 and 3 ml/min to form the non-doped layer 22 of 6H SiC single crystals on the substrate 3. In this case, by supplying a pulsed flow of fluorine gas through the additive gas supply pipe 12, fluorine atoms can effectively interfere with the movement of Si and C atoms and SiC molecules during the epitaxial growth. As a result, the non-doped layer 22 has a planar surface.

Subsequently, the n-type doped layer 23 is formed on the non-doped layer 22 by continuously supplying nitrogen gas as a doping gas. The n-type doped layer 23 will be a channel layer of the MESFET. In this case, the doping process is performed by repeatedly opening and closing the pulse valve 20 of the additive gas supply pipe 12 while supplying the source and diluting gases through the pipes 7 and 9. The valve outlet pressure of the pressure reducer for the gas cylinder in the gas supply system 8 is kept constant at 78400 Pa (0.8 kgf/cm$^2$). The length of the interval during which the pulse valve 20 is opened (i.e., pulse duration) is set at 100 μs and that of the interval during which the pulse valve 20 is closed (i.e., pulse-to-pulse interval) is set at 4 ms. In this manner, the n-type doped layer 23 with a carrier concentration of $4 \times 10^{17}$ atoms·cm$^{-3}$ is formed. The thickness of the n-type doped layer 23 is set at about 200 nm by adjusting the lengths of the intervals during which the pulse valve 20 is opened and closed.

Thereafter, a nickel (Ni) layer is deposited by a vacuum evaporation technique on the n-type doped layer 23, thereby forming the source/drain electrodes 27 and 28. Then, the substrate is annealed at 1000° C. for three minutes to make the source/drain electrodes 27, 28 come into ohmic contact with the n-type doped layer 23. Subsequently, a gold (Au) layer is deposited on the n-type doped layer 23, thereby forming the gate electrode 26 such that the gate electrode 26 makes Schottky contact with the n-type doped layer 23. Optionally, the contact or sheet resistance may be reduced by selectively implanting n-type dopant ions into only the contact regions between the source/drain electrodes 27, 28 and the n-type doped layer 23.

Figure 11:
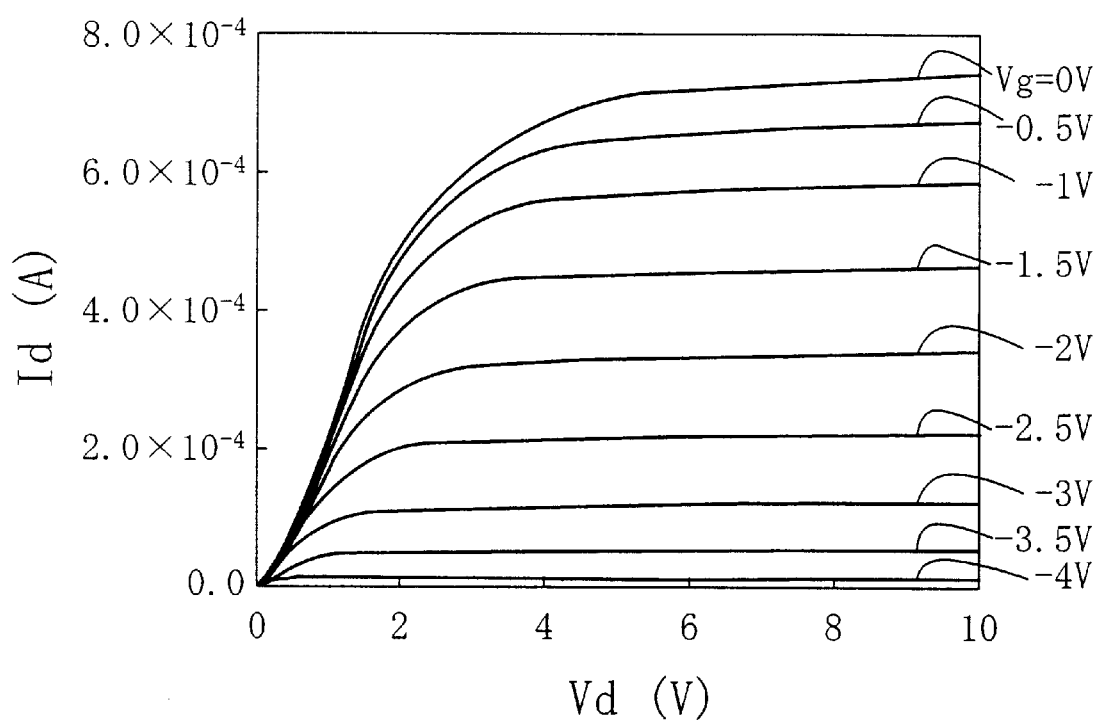
FIG. 11 illustrates I–V characteristics between drain currents and gate voltages for the MESFET according to the second embodiment.

FIG. 11 illustrates I–V characteristics between drain currents and gate voltages for the MESFET according to the second embodiment. In FIG. 11, the axis of abscissas represents the drain voltage Vd (V), the axis of ordinates represents the drain current Id (A) and a gate voltage Vg is used as a parameter. In this case, the channel layer (i.e., the n-type doped layer) of the MESFET is about 200 nm thick, the carrier density in the channel layer is $4 \times 10^{17}$ atoms·cm$^{-3}$ and the gate length is about 0.5 μm. As can be seen from FIG. 11, good pinch-off characteristics are attainable at a negative gate voltage with an absolute value of 4 V or more. This is because the drain current Id is substantially zero due to a pinch off phenomenon caused in the channel (i.e., the formation of a depletion layer).

In the MESFET according to this embodiment, a steeply rising n-type dopant (i.e., nitrogen in this case) concentration profile exists in the transition region between the n-type doped layer 23 (i.e., the channel layer) and the non-doped layer 22 (i.e., the underlying layer) as shown in FIG. 4. Accordingly, as the depletion region expands in the channel layer upon the application of voltages to the gate and drain electrodes 26, 28, the channel layer is closed by the depletion region almost completely due to the existence of the sharply rising concentration profile. In contrast, in the conventional doped layer on the SiC substrate, the dopant concentration profile in the transition region is gentler as shown in FIG. 5. Thus, it is not clear exactly when the channel layer will be almost closed after the depletion layer has reached the transition region.

That is to say, in the MESFET formed by the inventive pulsed doping technique, that steeply rising dopant (i.e., N in this case) concentration profile appears in the transition region between the underlying layer (i.e., the non-doped layer 22) and the channel layer (i.e., the n-type doped layer 23). Accordingly, the amount of current leaking from the channel layer into the underlying layer decreases. As a result, the current consumed can be reduced and the transconductance of the MESFET can be increased. In addition, since excellent pinch-off characteristics are also attainable, the MESFET can be driven with a lower voltage applied.

In addition, according to this embodiment, fluorine and nitrogen gases are supplied intermittently by repeatedly opening and closing the pulse valve 20 during the epitaxial growth of the non-doped and n-type doped layers 22, 23, respectively. Thus, the interface between the non-doped and n-type doped layers 22, 23 can be planarized, thus further improving the pinch-off characteristics.

Taking all of these results into account, a MESFET that can attain various effects such as low current dissipation, low voltage driving and high gain is realized by forming the n-type channel layer of SiC crystals using the pulse valve 20.

In the foregoing embodiment, the MESFET is formed by using the n-type doped layer as a channel layer. Alternatively, the inventive technique is effectively applicable to forming a Schottky diode by growing an n- or p-type doped layer or forming a pn diode by growing n- and p-type doped layers.

Although the present invention is applied to forming a MESFET in this embodiment, a MOSFET may also be formed by growing n- and p-type doped layers.

EMBODIMENT 3

Next, a method of controlling a dopant concentration by adjusting the pulse duration of a gas supplied through the pulse valve will be described as a third exemplary embodiment of the present invention.

Figure 12:
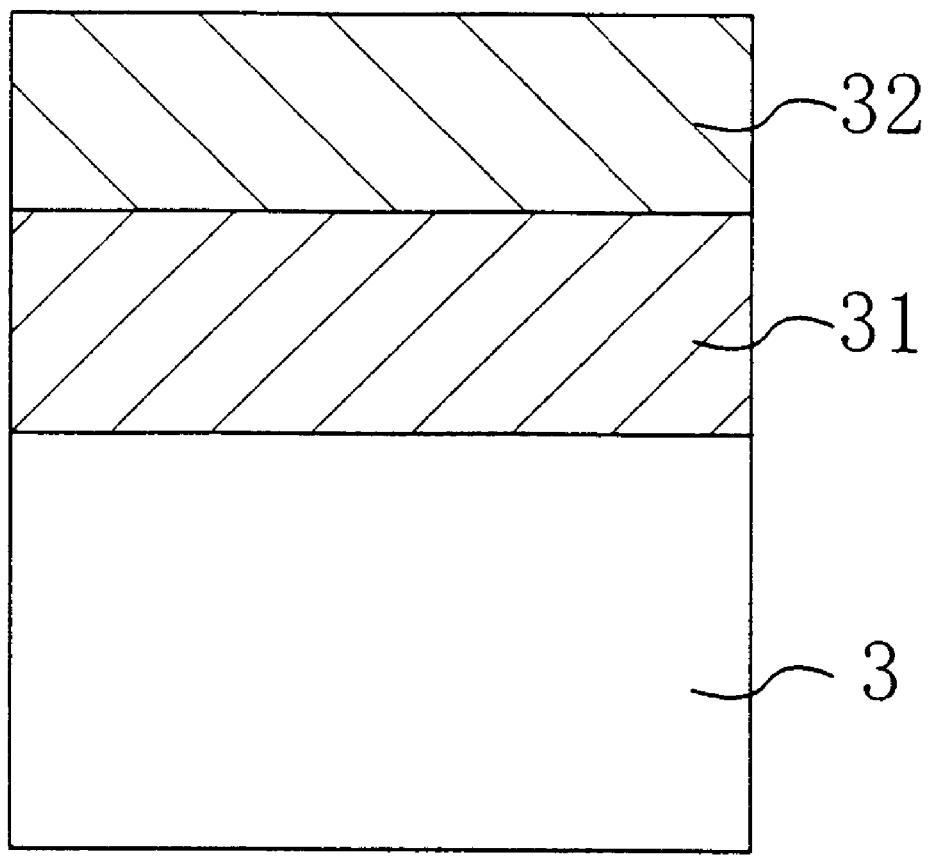
FIG. 12 is a cross-sectional view illustrating a semiconductor device according to a third embodiment of the present invention.

FIG. 12 is a cross-sectional view illustrating a semiconductor device according to the third embodiment. As shown in FIG. 12, the semiconductor device also uses a 6H SiC substrate 3 with an off-axis (0001) principal surface. A heavily doped layer 31 is formed on the substrate 3 by epitaxially growing SiC single crystals thereon while supplying a pulsed flow of a dopant (N) gas onto the substrate 3. And a lightly doped layer 32 is formed on the heavily doped layer 31 by epitaxially growing SiC single crystals thereon while supplying a pulsed flow of the dopant (N) gas onto the heavily doped layer 31. The structure shown in FIG. 12 is applicable to the active region in any of various types of devices.

Figure 13A:
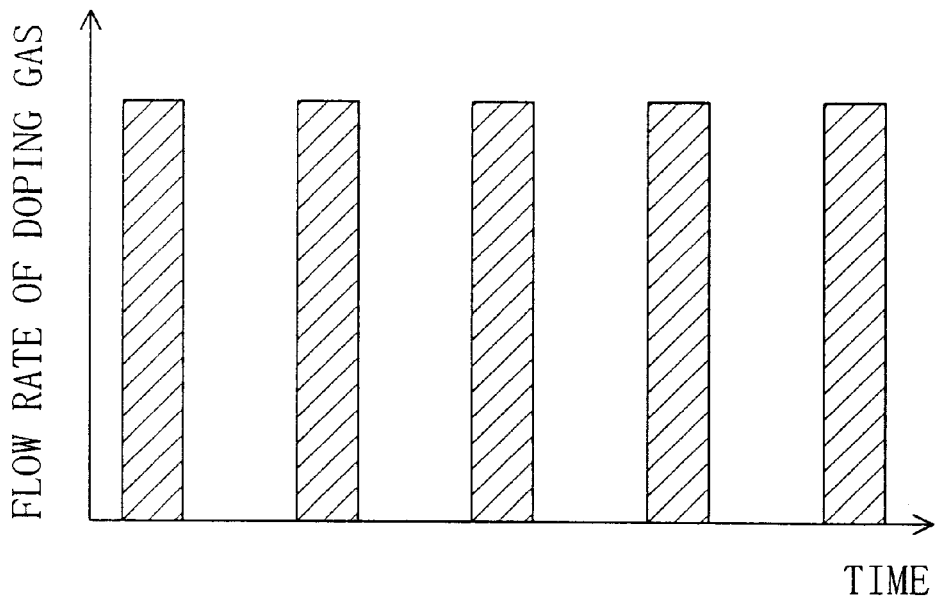
FIGS. 13(a) and 13(b) illustrate how the pulse valve should be opened and closed to form heavily and lightly doped layers, respectively, in accordance with the third embodiment.
Figure 13B:
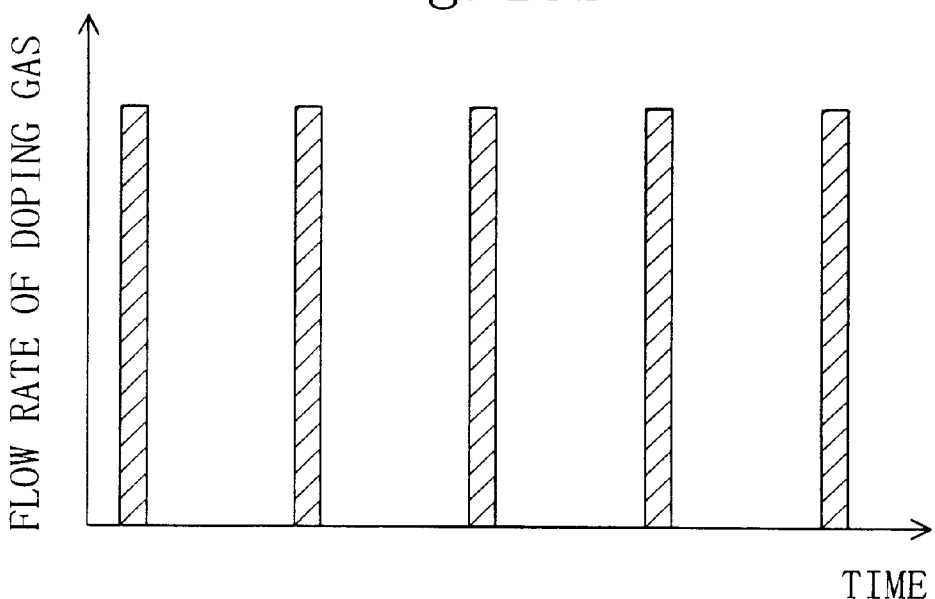

Hereinafter, a method for fabricating a semiconductor device according to the third embodiment will be described. FIGS. 13(a) and 13(b) illustrate how the pulse valve should be opened and closed to form the heavily and lightly doped layers, respectively, in accordance with the third embodiment.

The fabricating method of the third embodiment is characterized by adaptively changing the pulse duration, or the length of the interval during which the pulse valve 20 shown in FIG. 1 is opened. Specifically, in forming the heavily doped layer 31, the pulse duration is extended as shown in FIG. 13(a). On the other hand, in forming the lightly doped layer 32, the pulse duration is shortened as shown in FIG. 13(b). By adaptively changing the pulse duration of the gas supplied through the pulse valve 20 in this manner, the dopant concentration is controllable as shown in FIG. 8. Thus, a doped layer with a desired dopant concentration can be formed on the substrate 3 very easily.

In the third embodiment, a MESFET with an increased breakdown voltage, which includes the heavily doped layer 31 as its channel layer and the lightly doped layer 32 with a high effective Schottky barrier, can be formed by performing a process similar to that exemplified in the second embodiment using the structure shown in FIG. 12. It should be noted that respective regions of the lightly doped layer 32, which are located below source/drain electrodes, are preferably doped heavily in advance through ion implantation, for example.

In addition, a MISFET with increased breakdown voltage and improved punchthrough stop function may also be formed to have a retrograde well by using the structure shown in FIG. 12.

Also, the heavily and lightly doped layers 31 and 32 may contain dopants of mutually opposite conductivity types.

EMBODIMENT 4

Next, a method of controlling the concentrations of source gases in growing an SiGeC film heteroepitaxially on an Si substrate will be described as a fourth exemplary embodiment of the present invention.

Figure 14:
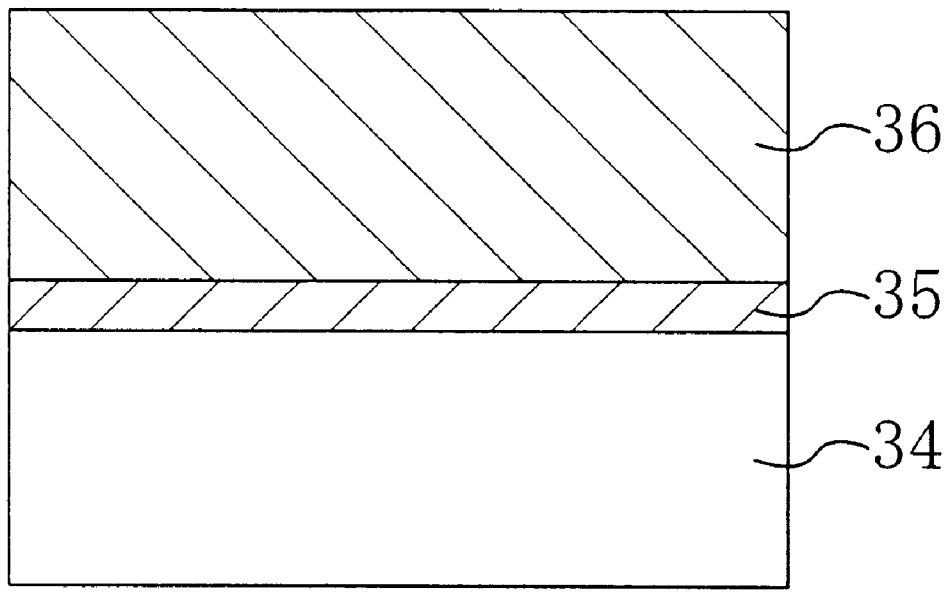
FIG. 14 is a cross-sectional view illustrating a structure of part of an Si/SiGeC heterojunction device that will be an active region according to a fourth embodiment of the present invention.

FIG. 14 is a cross-sectional view illustrating a structure for a part of an Si/SiGeC heterojunction device according to the fourth embodiment. This part will become an active region of the device. As shown in FIG. 14, an Si buffer layer 35 is grown homoepitaxially on an Si substrate 34 with a (001) principal surface, and an $Si_{1-x-y}Ge_yC_x$ layer 36 is grown heteroepitaxially on the Si buffer layer 35.

Hereinafter, a method for fabricating the Si/SiGeC heterojunction device according to the fourth embodiment will be described.

In the illustrated embodiment, an Si substrate 34 with a diameter of 8 inches is used, and a chamber with almost the same structure as that of the chamber 1 shown in FIG. 1 is used. However, in the chamber according to the fourth embodiment, source gases are supplied through respective gas supply pipes each provided with a pulse valve. Specifically, according to the fourth embodiment, first, second and third source gas supply pipes are provided for supplying $Si_2H_6$, $GeH_4$ and $SiH_3CH_3$ gases as sources of Si, Ge and C, respectively. Inside the chamber, gas inlet pipes, which are similar to the gas inlet pipe 13 shown in FIG. 1, are provided to extend from respective ends of the first through third source gas supply pipes to the vicinity of the upper surface of the substrate 34. A flow meter with flow rate regulating function is provided for a diluting gas supply pipe for supplying hydrogen gas as a diluting gas. The diluting gas supply pipe is connected to the chamber separately from the source gas supply pipes.

Hereinafter, a method for fabricating the SiGeC device according to the fourth embodiment will be described with reference to FIGS. 15(a) and 15(b), which illustrate how respective pulse valves should be opened and closed in the fabrication process of the semiconductor device. In the illustrated embodiment, the sum of an interval during which each pulse valve is opened (i.e., pulse duration) and the succeeding interval during which the pulse valve is closed (i.e., pulse-to-pulse interval) is set constant at 4 ms.

First, the substrate 34 is placed on the susceptor such as that shown in FIG. 1 and the pressure inside the chander is reduced to create a vacuum at a pressure of about $10^{-6}$ Pa (=about $10^{-8}$ Torr). Next, hydrogen gas is supplied as a diluting gas from the gas supply system at a flow rate of 50 ml/min, thereby reducing the pressure inside the chamber to 0.13 Pa (=$1 \times 10^{-3}$ Torr). The pressure inside the chamber is controllable based on the valve travel of the pressure regulating valve of the exhaust pipe such as that shown in FIG. 1. An RF power of 20 kW is applied to the coil at a frequency of 20.0 kHz using an induction heater with the flow rate of hydrogen gas kept constant, thereby heating the susceptor. The temperature of the substrate 34 is also kept constant at about 600° C.

Then, only the pulse valve of the first source gas supply pipe is opened with the flow rate of hydrogen gas still kept constant, thereby supplying $Si_2H_6$ gas as a source gas into the chamber.

Figure 15A:
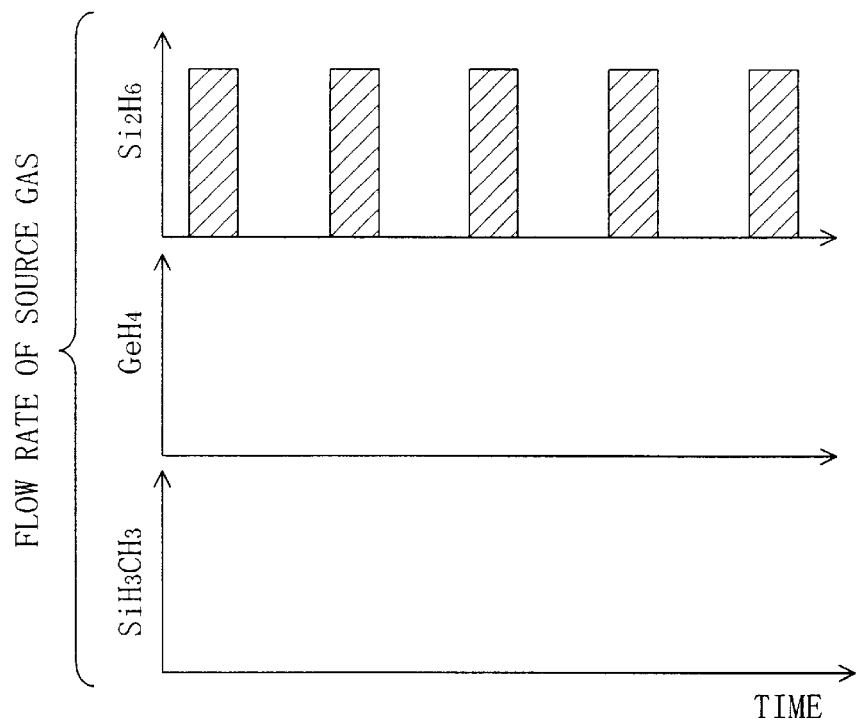
FIGS. 15(a) and 15(b) illustrate how respective pulse valves should be opened and closed in fabricating a semiconductor device in accordance with the fourth embodiment.

In this case, the pulse valve of the first source gas supply pipe is opened to supply the $Si_2H_6$ gas for 100 $\mu$s, while the second and third source gas supply pipes for supplying $GeH_4$ and $SiH_3CH_3$ gases are closed as shown in FIG. 15(a). In this manner, the Si buffer layer 35 is grown homoepitaxially to a thickness of about 10 nm on the substrate 34.

Subsequently, the pulse valves of the first, second and third source gas supply pipes are opened and closed at controlled timing with the flow rate of the hydrogen gas still kept constant, thereby supplying $Si_2H_6$, $GeH_4$ and $SiH_3CH_3$ as respective source gases into the chamber. As a result, the $Si_{1-x-y}Ge_yC_x$ layer 36 is grown heteroepitaxially to a thickness of about 200 nm on the Si buffer layer 35.

Figure 15B:
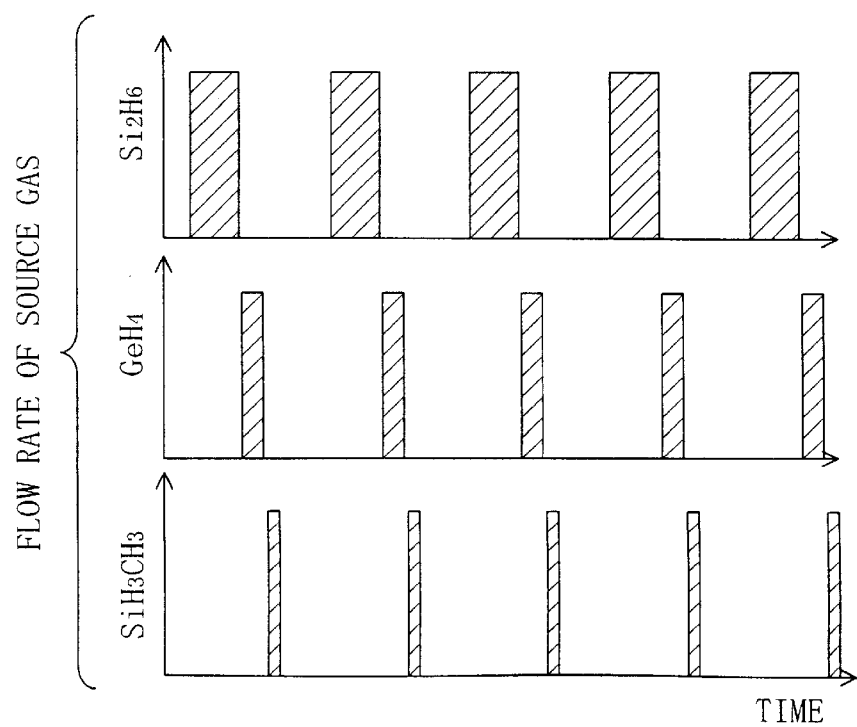
Figure 16:
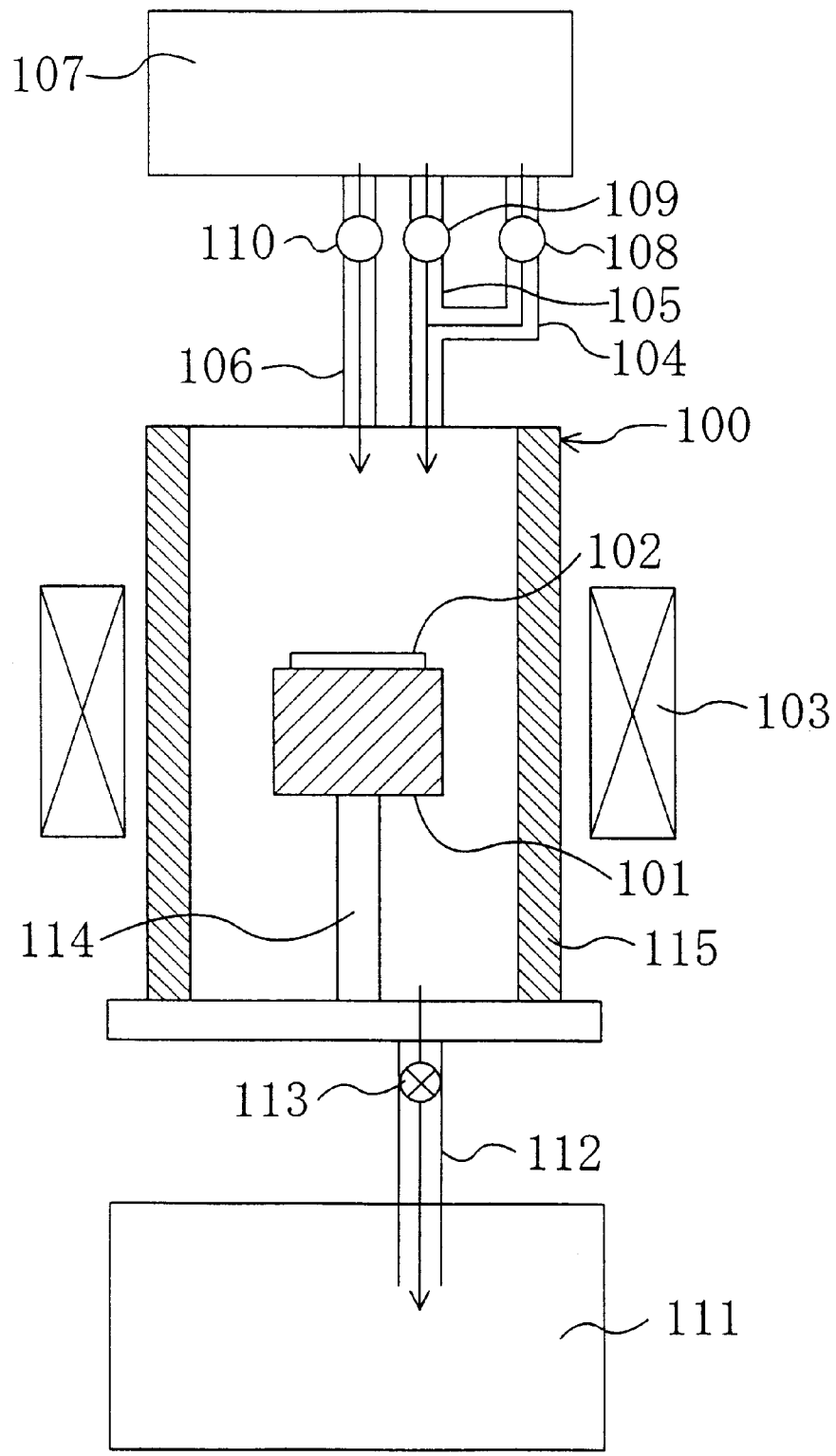
FIG. 16 schematically illustrates a structure for a conventional vertical crystal grower that is used to form an SiC film.

In this case, the pulse valves of the first, second and third source gas supply pipes are opened to supply the $Si_2H_6$, $GeH_4$ and $SiH_3CH_3$ gases for 70, 20 and 10 $\mu$s, respectively, as shown in FIG. 15(b). Also, these $Si_2H_6$, $GeH_4$ and $SiH_3CH_3$ gases are supplied alternately such that the respective intervals during which the pulses valves are opened do not overlap with each other. In this manner, the $Si_{1-x-y}Ge_yC_x$ layer 36 is grown heteroepitaxially to have a Ge mole fraction y of about 0.2 (=about 20%) and a C mole fraction x of about 0.01 (=about 1%).

According to the fourth embodiment, pulse valves are provided for the source gas supply pipes and the respective intervals during which these pulse valves are opened (pulse lengths) or closed (pulse-to-pulse intervals) are adaptively controlled. Thus, the resulting $Si_{1-x-y}Ge_yC_x$ layer shows steeply rising dopant (i.e., Ge and C) concentration profiles in the transition region between the Si buffer layer 35 and the $Si_{1-x-y}Ge_yC_x$ layer 36 as in the first embodiment.

After the structure shown in FIG. 14 has been formed, gate insulating film, source/drain regions, gate electrode and so on are formed, thereby obtaining a heterojunction MISFET operating at high speeds by taking advantage of the steep heterobarrier between the $Si_{1-x-y}Ge_yC_x$ layer and Si buffer layer.

Also, as in the first embodiment, an $Si_{1-x-y}Ge_yC_x$ layer with a planar surface can be obtained according to the fourth embodiment by supplying pulsed flows of the source gases. The Si substrate used here has a (001) principal surface. Thus, some level differences are formed thereon but are not so noticeable as those illustrated in FIG. 6(a) even without applying the method of this embodiment. That is to say, compared to the conventional method, a sufficiently planar surface can be obtained with its surface roughening suppressed. It is noted that if an Si substrate with an offaxis (111) principal surface is used, then an $Si_{1-x-y}Ge_yC_x$ layer with excellent planarity can be obtained according to this embodiment without causing the large level differences such as those shown in FIG. 6(a).

In the foregoing embodiment, the pulse valves are provided for all of the first through third source gas supply pipes. Alternatively, the first and second source gas supply pipes may be provided with no pulse valves and only the third source gas supply pipe may be provided with the pulse valve. In such an alternative embodiment, the flow rates of the source gases passing through the first and second pipes may be controlled using flow meters, and only the $SiH_3CH_3$ gas may be supplied by pulse flow as the source gas of C.

Also, in the foregoing embodiment, the present invention has been described as being applied to growing an SiGeC layer epitaxially. Alternatively, the inventive thin film growing method is applicable to growing an SiGe, GaAs or GaN layer heteroepitaxially as well as the SiGeC layer. Even in any of these alternative embodiments, a single crystal film can be grown to have a steeply rising concentration profile in its transition region.

What is claimed is:

1. A method for growing a semiconductor film epitaxially on a single crystal region of a substrate, the method comprising the steps of:
   a) placing the substrate within a chamber; and
   b) forming the semiconductor film by supplying not only a source gas, which contains a constituent of the semiconductor film to be formed, but also an additive gas into the chamber after the step a) has been performed, the additive gas being supplied through a pulse valve without a flow meter at least once.

2. The method of claim 1, wherein in the step b), the additive gas is also supplied at a flow rate, which accounts for a predetermined percentage or less of the height of the pulse, even in an interval during which the additive gas is not supplied as the pulse flow.

3. The method of claim 1, wherein in the step b), an interval during which the additive gas is not supplied as the pulse flow is longer than an interval during which the additive gas is supplied as the pulse flow.

4. The method of claim 1, wherein in the step b), a gas containing dopant atoms is supplied as the additive gas.

5. The method of claim 4, wherein in the step b), a dopant concentration profile of the film is controlled by adjusting a pulse duration, the pulse duration being the length of an interval during which the additive gas is supplied by the pulse flow.

6. The method of claim 1, wherein in the step b), at least one of an inert gas and a gas containing a halogen is supplied as the additive gas.

7. The method of claim 1, wherein the substrate is an SiC substrate having its principal surface slightly tilted from a (0001) plane.

8. A method for growing a semiconductor film epitaxially by a CVD process on a single crystal region of a substrate such that the semiconductor film will be made of a compound of multiple elements, the method comprising the steps of:
   a) placing the substrate within a chamber; and
   b) forming the semiconductor film by supplying source gases, which contains the respective elements of the semiconductor film to be formed, into the chamber after the step a) has been performed, at least one of the source gases being supplied through a pulse valve without a flow meter at least once.

9. The method of claim 8, wherein in the step b), at least two of the source gases are alternately supplied as pulse flows such that an interval during which one of these two source gases is pulsed does not overlap with an interval during which the other source gas is pulsed.

10. The method of claim 8, wherein in the step b), a composition of the compound for the semiconductor film is controlled by adjusting a pulse duration, the pulse duration being the length of an interval during which the at least one source gas is supplied as the pulse flow.

11. A method for fabricating a semiconductor device, comprising the steps of:
   a) growing a doped semiconductor layer epitaxially over a substrate by supplying, onto the substrate, not only a source gas but also a gas containing a dopant by pulse flow at least once;
   b) forming a gate electrode on the doped semiconductor layer such that the gate electrode makes Schottky contact with the doped semiconductor layer; and
   c) forming source and drain electrodes on right- and left-hand sides of the gate electrode over the doped semiconductor layer such that the source and drain electrodes make ohmic contact with the doped semiconductor layer.

12. The method of claim 11, further comprising the step of forming, before the step a) is performed, a non-doped semiconductor layer on the substrate by supplying the same source gas as that will be supplied in the step a).

13. A method for fabricating a heterojunction semiconductor device, the device including first and second semiconductor layers formed in this order on a substrate such that a heterobarrier is formed between the first and second semiconductor layers, the method comprising the steps of:
   a) forming the first semiconductor layer on the substrate; and
   b) growing the second semiconductor layer heteroepitaxially on the first semiconductor layer by supplying multiple source gases, at least one of the source gases being supplied by pulse flow at least once.

14. A method for growing a semiconductor film epitaxially on a single crystal region of a substrate, the method comprising the steps of:
   a) placing the substrate within a chamber; and
   b) forming the semiconductor film by supplying not only a source gas, which contains a constituent of the semiconductor film to be formed, but also an additive gas containing dopant atoms into the chamber after the step a) has been performed, the additive gas being supplied through a pulse valve at least once,
   wherein in the step b), a dopant concentration profile of the film is controlled by adjusting a pulse duration, the pulse duration being the length of an interval during which the additive gas is supplied through the pulse valve.

* * * * *